United States Patent
Yang et al.

(10) Patent No.: US 11,721,783 B2
(45) Date of Patent: Aug. 8, 2023

(54) SOLAR CELL AND METHOD FOR MANUFACTURING THE SAME

(71) Applicants: JINKO GREEN ENERGY (SHANGHAI) MANAGEMENT CO., LTD, Shanghai (CN); ZHEJIANG JINKO SOLAR CO., LTD, Yuan Hua (CN)

(72) Inventors: Jie Yang, Shanghai (CN); Zhao Wang, Shanghai (CN); Peiting Zheng, Shanghai (CN); Xinyu Zhang, Shanghai (CN); Hao Jin, Shanghai (CN)

(73) Assignee: Shangrao Jinko solar Technology Development Co., LTD, Jiangxi Province (CN)

(*) Notice: Subject to any disclaimer, the term of this patent is extended or adjusted under 35 U.S.C. 154(b) by 0 days.

(21) Appl. No.: 17/578,868

(22) Filed: Jan. 19, 2022

(65) Prior Publication Data
US 2022/0140178 A1 May 5, 2022

Related U.S. Application Data

(63) Continuation of application No. 17/005,869, filed on Aug. 28, 2020, now Pat. No. 11,264,529.

(30) Foreign Application Priority Data
Aug. 24, 2020 (CN) .......................... 202010857263.X

(51) Int. Cl.
*H01L 31/20* (2006.01)
*H01L 31/0216* (2014.01)
(Continued)

(52) U.S. Cl.
CPC ...... *H01L 31/202* (2013.01); *H01L 31/02167* (2013.01); *H01L 31/022425* (2013.01);
(Continued)

(58) Field of Classification Search
CPC .......... H01L 31/202; H01L 31/022425; H01L 31/208; H01L 31/02167; H01L 31/0747; H01L 31/1864
See application file for complete search history.

(56) References Cited

U.S. PATENT DOCUMENTS

| | | | |
|---|---|---|---|
| 8,927,313 B2 * | 1/2015 | Lee | H01L 31/1804 438/548 |
| 8,969,125 B2 * | 3/2015 | Lee | H01L 31/02363 438/71 |

(Continued)

FOREIGN PATENT DOCUMENTS

| | | |
|---|---|---|
| CN | 102157578 A | 8/2011 |
| CN | 103238220 A | 8/2013 |

(Continued)

OTHER PUBLICATIONS

Chinese Office Action in related Chinese application 202010857263.X dated Sep. 3, 2021.
(Continued)

*Primary Examiner* — Earl N Taylor
(74) *Attorney, Agent, or Firm* — Pillsbury Winthrop Shaw Pittman, LLP; Chad Hammerlind

(57) ABSTRACT

Provided is a solar cell and a method for manufacturing the same, the method includes: forming a doped layer on a surface of a semiconductor substrate, the doped layer having a first doping concentration of a doping element in the doped layer; depositing, on a surface of the doped layer, a doped amorphous silicon layer including the doping element; selectively removing at least one region of the doped amor-
(Continued)

phous silicon layer; performing annealing treatment, for the semiconductor substrate to form a lightly doped region having the first doping concentration and a heavily doped region having a second doping concentration in the doped layer, the second doping concentration is greater than the first doping concentration; and forming a solar cell by post-processing the annealed semiconductor substrate. The solar cell and the method for manufacturing the same simplify the manufacturing process and improve conversion efficiency of the solar cell.

19 Claims, 3 Drawing Sheets

(51) Int. Cl.
  *H01L 31/0224* (2006.01)
  *H01L 31/18* (2006.01)
  *H01L 31/0747* (2012.01)

(52) U.S. Cl.
  CPC ...... *H01L 31/0747* (2013.01); *H01L 31/1864* (2013.01); *H01L 31/208* (2013.01)

(56) References Cited

U.S. PATENT DOCUMENTS

| | | | | |
|---|---|---|---|---|
| 9,029,188 | B2* | 5/2015 | Ha | H01L 31/02168 |
| | | | | 438/98 |
| 9,214,584 | B2* | 12/2015 | Yang | H01L 31/1804 |
| 2009/0020158 | A1* | 1/2009 | Ohtsuka | H01L 31/0682 |
| | | | | 257/E21.135 |
| 2010/0108129 | A1* | 5/2010 | Ahn | H01L 31/1804 |
| | | | | 136/255 |
| 2010/0229925 | A1* | 9/2010 | Kim | H01L 31/022425 |
| | | | | 257/E31.032 |
| 2010/0240172 | A1* | 9/2010 | Rana | H01L 31/022441 |
| | | | | 438/96 |
| 2010/0326504 | A1* | 12/2010 | Park | H01L 31/0232 |
| | | | | 257/E31.127 |
| 2013/0056051 | A1* | 3/2013 | Jin | H01L 31/022425 |
| | | | | 257/E31.032 |
| 2014/0096820 | A1* | 4/2014 | Neumayer | H01L 31/1804 |
| | | | | 136/258 |
| 2014/0256084 | A1* | 9/2014 | Ha | H01L 31/1864 |
| | | | | 438/98 |
| 2016/0118510 | A1* | 4/2016 | Wu | H01L 31/02167 |
| | | | | 438/98 |
| 2020/0313010 | A1* | 10/2020 | Nanba | H01L 31/02167 |
| 2022/0140178 | A1* | 5/2022 | Yang | H01L 31/022425 |
| | | | | 438/96 |

FOREIGN PATENT DOCUMENTS

| | | |
|---|---|---|
| CN | 207398153 U | 5/2018 |
| CN | 111063761 B1 | 4/2020 |
| CN | 111370539 A | 7/2020 |
| CN | 112133763 A | 12/2020 |
| KR | 101199649 B1 | 11/2012 |
| KR | 101382047 B1 | 4/2014 |
| WO | 2010/033744 B2 | 3/2010 |
| WO | 2015/148570 A1 | 10/2015 |

OTHER PUBLICATIONS

Extended Search Report, EP Application No. 20193423.9, dated Feb. 11, 2021, 9 pages.

* cited by examiner

SOLAR CELL AND METHOD FOR MANUFACTURING THE SAME

CROSS-REFERENCE TO RELATED APPLICATIONS

This application is a continuation of U.S. patent application Ser. No. 17/005,869, filed on Aug. 28, 2020, which claims priority to Chinese Patent Application No. 202010857263.X, filed on Aug. 24, 2020, each of which is incorporated herein by reference in its entirety.

TECHNICAL FIELD

The present disclosure relates to the technical field of a solar energy and, in particular, to a solar cell and a method for manufacturing the solar cell.

BACKGROUND

In order to improve the conversion efficiency of a solar cell, a selective emitter (SE) structure may be formed on the surface of the solar cell. In one case, a laser doping method can be used to prepare the selective emitter, but the laser doping method may damage the laser region, resulting in a negative impact on the conversion efficiency. In another case, a reverse etching method may be used to prepare the selective emitter, but the reverse etching method may destroy a pyramid structure on a front side of the solar cell, thereby reducing its anti-reflection effect and resulting in a negative impact on the conversion efficiency. In addition, lightly doped regions and heavily doped regions of the selective emitter are both implemented on a surface of the crystalline silicon substrate, the solid solubility of a doping element in the crystalline silicon may be relatively low, which may lead to a contact resistance with a metal grid is relatively high. Therefore, it is desirable to develop a method for manufacturing the selective emitter of the solar cell, which may improve the conversion efficiency of the solar cell.

SUMMARY

In view of the above problems, the present disclosure proposes a solar cell and a method for manufacturing a solar cell, where a doped amorphous silicon layer is adopted as a doping source, to realize selective heavy doping of an emitter and simplify the manufacture process of the solar cell, and there is a certain height difference between a lightly doped region and a heavily doped region in the structure of a formed selective emitter, which is beneficial to improving the conversion efficiency of the solar cell.

An embodiment of the present disclosure provides a method for manufacturing a solar cell, the method includes the following steps:

forming a doped layer on a surface of a semiconductor substrate, the doped layer having a first doping concentration of a doping element in the doped layer;

depositing, on a surface of the doped layer, a doped amorphous silicon layer including the doping element;

selectively removing at least one region of the doped amorphous silicon layer;

performing an annealing treatment, for the semiconductor substrate including the doped layer and the doped amorphous silicon layer, to form a lightly doped region having the first doping concentration and a heavily doped region having a second doping concentration in the doped layer, wherein the second doping concentration is greater than the first doping concentration; and forming the solar cell by post-processing the annealed semiconductor substrate.

In an embodiment, a thickness of the doped amorphous silicon layer is in a range from 20 nm to 300 nm.

In an embodiment, the step of depositing, on a surface of the doped layer, a doped amorphous silicon layer including the doping element includes:

forming an amorphous silicon layer on the surface of the doped layer and simultaneously performing in-situ doping to form the doped amorphous silicon layer; or depositing an amorphous silicon layer on the surface of the doped layer, and then doping on the amorphous silicon layer to form the doped amorphous silicon layer.

In an embodiment, the step of selectively removing at least one region of the doped amorphous silicon layer includes:

providing a protective layer on a predetermined grid line region of a surface of the doped amorphous silicon layer; and etching a non-predetermined grid line region of the doped amorphous silicon layer with an etching solution and removing the protective layer; or removing a part of the doped amorphous silicon layer corresponding to a non-predetermined grid line region of a surface of the doped amorphous silicon layer by a laser removing manner.

In an embodiment, the step of depositing, on a surface of the doped layer, a doped amorphous silicon layer including the doping element is performed by any one of a chemical vapor deposition, a physical vapor deposition and an atomic layer deposition.

In an embodiment, the step of doping on the surface of the semiconductor substrate to form the doped layer includes:

forming the doped layer having a polarity opposite to the semiconductor substrate by adopting any one of a high temperature diffusion process, a paste doping process, or an ion implantation process.

In an embodiment, a square resistance of the doped layer is in a range from 80 $\Omega$/sqr to 400 $\Omega$/sqr.

In an embodiment, the annealing treatment is performed under protection of an inert atmosphere, and the inert atmosphere includes at least one of nitrogen gas and argon gas; and/or a temperature of the annealing treatment is in a range from 700° C. to 950° C.

In an embodiment, the step of the forming a solar cell by post-processing the annealed semiconductor substrate includes:

performing a passivation treatment on the surface of the annealed semiconductor substrate to form at least one passivated layer; and performing a metallization treatment on the surface of the passivated semiconductor substrate to form at least one electrode, the at least one electrode penetrating through the at least one passivated layer to form ohmic contact with the heavily doped region of the doped layer.

According to another aspect of the present disclosure, the present disclosure provides a solar cell manufactured by the method for manufacturing the solar cell described above.

Compared with the related art, the technical solutions according to the present disclosure can bring at least following beneficial effects:

In the method for manufacturing a solar cell according to the present disclosure, the doped amorphous silicon layer is deposited on the surface of the semiconductor substrate on which the doped layer is formed; a chemical or physical method is adopted to remove a part of the doped amorphous silicon layer; the annealing treatment is performed to crystallize the doped amorphous silicon layer into a doped amorphous silicon layer (i.e., the doped layer), and during the annealing process, excess non-crystallizable doping atoms in the doped amorphous silicon layer will be pushed into the doped layer (the lightly doped region) of the surface of the semiconductor substrate to realize locally heavy doping of the doped layer, such that the doped layer includes a lightly doped region having a first doping concentration and a heavily doped region having a second doping concentration, to form a selective emitter.

In this method, the doped amorphous silicon layer has a relatively low crystallization temperature, thereby avoiding defects in the semiconductor substrate due to an excessively high heavily doping temperature; after the doped amorphous silicon layer is crystallized, the doping concentration of the doping atoms in the doped layer is controlled by the deposition process of the amorphous silicon layer, and excessive doping element is not required in heavily doping, thereby avoiding adverse effects such as the boron-rich layer; the doping element in the heavily doped region of the doped layer has relatively high solid solubility, and higher activation doping and lower contact resistance can be achieved; the heavily doped region of the doped layer is higher than the surface (or the lightly doped region) of the semiconductor substrate, so that the impact of "breakdown effect" in a sintering process of Ag and/or Al paste on the front side of a N-type solar cell can be reduced.

BRIEF DESCRIPTION OF DRAWING

In order to more clearly describe the technical solutions of the embodiments of the present disclosure or the related art, accompany drawings required in the description of the embodiments or the related art will be briefly introduced below. It is apparent that, the accompany drawings in the following description are only some embodiments of the present disclosure, and for those of ordinary skill in the art, other drawings may be obtained based on these drawings without creative work.

DESCRIPTION OF EMBODIMENTS

Figure 1:
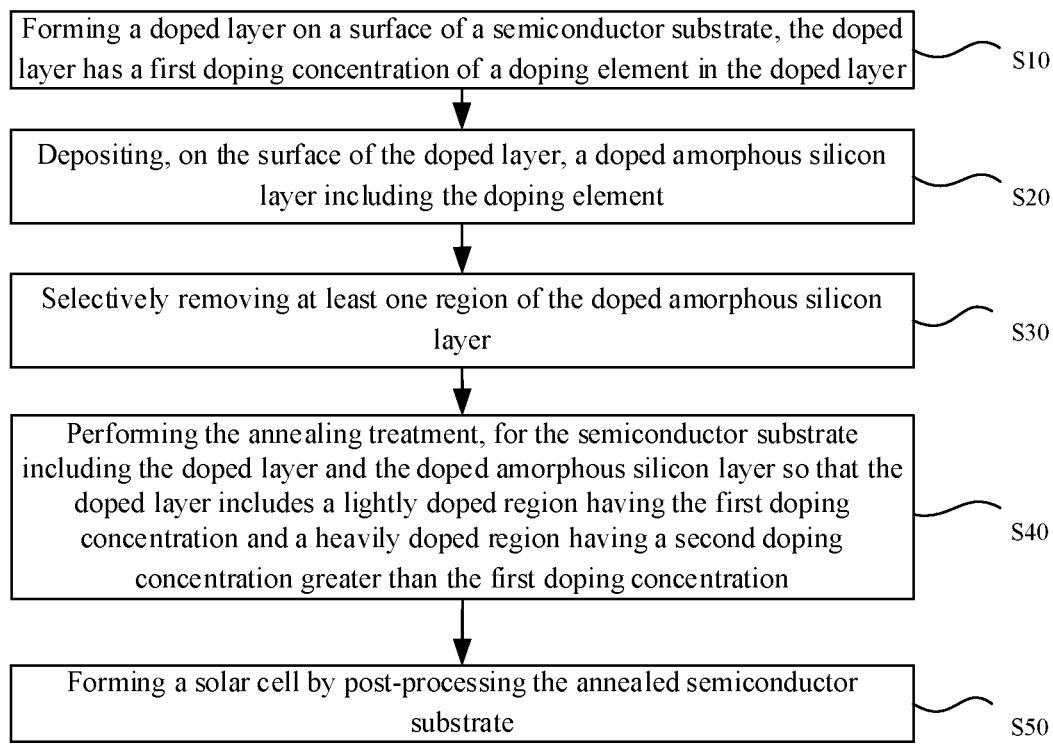
FIG. 1 is a schematic flow chart of a method for manufacturing a solar cell according to one or more embodiments of the present disclosure.

In order to better understand the technical solutions of the present disclosure, the embodiments of the present disclosure are described in detail below with reference to the accompanying drawings.

It should be clear that the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

The terms used in the embodiments of the present disclosure are only for the purpose of describing specific embodiments and are not intended to limit the present disclosure. The singular form "a", "an" "said" and "the" used in the embodiments and appended claims of the present disclosure are also intended to represent a plural form thereof, unless the context clearly indicates other meanings.

It should be understood that the term "and/or" used in this article is merely an association relationship describing associated objects. It means that there can be three kinds of relationships, for example, A and/or B, which may refer to: A alone exists, A and B exist at the same time, and B exists alone. In addition, the character "/" here generally indicates that the associated objects before and after "/" are in an "or" relationship.

In the related art, a laser doping method may be used to prepare a selective emitter, but the laser doping method may damage the laser region, resulting in a negative impact on the conversion efficiency; In another case, a reverse etching method may also be used to form the selective emitter, but the reverse etching method will destroy the pyramid structure on the front side of the solar cell, thereby reducing its anti-reflection effect and resulting in a negative impact on the conversion efficiency. In addition, lightly doped and heavily doped regions of the existing selective emitter structure are both implemented on the surface of crystalline silicon, the solid solubility of the doping element in the crystalline silicon may be relatively low, which may lead to a contact resistance with a metal grid is relatively high. Therefore, it is desirable to develop a method for manufacturing the selective emitter of the solar cell, which may improve the conversion efficiency of the solar cell.

Therefore, in order to overcome imperfections in the related art, the present disclosure provides a solar cell and a method for manufacturing a solar cell, in which a heavily doped amorphous silicon layer is adopted as a doping source to realize selective heavy doping of the emitter, to simplify the production process of a solar cell, improve the conversion efficiency of the solar cell, and reduce production costs.

In the first aspect, one or more embodiments of the present disclosure provides a method for manufacturing a solar cell, including following steps:

Forming a doped layer on a surface of a semiconductor substrate, the doped layer has a first doping concentration of a doping element in the doped layer;

Depositing, on a surface of the doped layer, a doped amorphous silicon layer including the doping element;

Selectively removing at least one region of the doped amorphous silicon layer;

Performing an annealing treatment, for the semiconductor substrate including the doped layer and the doped amorphous silicon layer so that the doped layer includes a lightly doped region having the first doping concentration and a heavily doped region having a second doping concentration, and the second doping concentration being greater than the first doping concentration; and Forming a solar cell by post-processing the annealed semiconductor substrate.

In accordance with the method for manufacturing the solar cell according to the present disclosure, the doped amorphous silicon layer is deposited on the surface of the semiconductor substrate on which the doped layer is formed; a chemical or physical method is adopted to remove a part of the doped amorphous silicon layer; the annealing treatment is performed to crystallize the doped amorphous silicon layer into a doped polycrystalline silicon layer (i.e., the doped layer), and during the annealing process, excess non-crystallizable doping atoms in the doped amorphous silicon layer will be pushed into the doped layer (the lightly doped region) of the surface of the semiconductor substrate to realize locally heavy doping of the doped layer, such that the doped layer includes a lightly doped region having a first doping concentration and a heavily doped region having a second doping concentration, to form the selective emitter.

It should be noted that the semiconductor substrate can be a crystalline silicon substrate (or a silicon substrate), such as a polycrystalline silicon substrate, a monocrystalline silicon substrate or a monocrystalline silicon-like substrate, and the semiconductor substrate may be a P-type silicon substrate or may also be an N-type silicon substrate, and the present disclosure does not limit the specific type of the semiconductor substrate.

It can be understood that, performing the annealing treatment to the semiconductor substrate may be designated that performing high temperature annealing treatment to the doped layer and the doped amorphous silicon layer as well at the same time, which is a doping process that forms a designated region through a one-step high-temperature annealing treatment, which can greatly simplify the manufacturing process of the solar cell.

The method for manufacturing a solar cell according to the present disclosure can be adopted to manufacture the N-type solar cell or the P-type solar cell, and it can further be adopted to make a solar cell having a tunnel oxide passivated contact (Topcon) structure or to make passivated emitter rear cells (PERC). Hereinafter, in conjunction with the accompanying drawings in the embodiments of the present disclosure, the method for manufacturing the solar cell will be described as follows, and the described embodiments are only a part of the embodiments of the present disclosure, not all the embodiments. Based on the embodiments of the present disclosure, all other embodiments obtained by those of ordinary skill in the art without creative work shall fall within the protection scope of the present disclosure.

Referring to FIG. 1. FIG. 1 is a flowchart for manufacturing a solar cell according to one or more embodiments of the present disclosure.

Step S10, forming a doped layer on a surface of a semiconductor substrate, the doped layer has a first doping concentration of a doping element in the doped layer. The formed doped layer and the semiconductor substrate may form a PN junction structure.

In one or more embodiments, any one or more methods of high temperature diffusion, paste doping or ion implantation can be adopted to form an N-type or P-type doped layer on the surface of the semiconductor substrate.

Taking a Topcon cell as an example, boron diffusion doping is performed on a front side of an N-type semiconductor substrate (a surface facing the sun), to form a P-type doped layer (P+ layer). Then, a boron-doped amorphous silicon layer is deposited on the surface of the P-type doped layer. In some embodiments, a boron concentration in the P-type doped layer is smaller than a boron concentration in the boron-doped amorphous silicon layer.

Taking a PERC cell as an example, phosphorus diffusion doping is performed on a front side of a P-type semiconductor substrate, to form an N-type doped layer (N+ layer). Then, a phosphorus-doped amorphous silicon layer is deposited on the surface of the N-type doped layer. In some embodiments, a phosphorus concentration in the N-type doped layer is smaller than a phosphorus concentration in the phosphorus-doped amorphous silicon layer.

Square resistance of the doped layer after the doping treatment ranges from 80 $\Omega$/sqr to 400 $\Omega$/sqr, and for example, it may be 80 $\Omega$/sqr, 100 $\Omega$/sqr, 150 $\Omega$/sqr, 200 $\Omega$/sqr, 250 $\Omega$/sqr, 300 $\Omega$/sqr, 350 $\Omega$/sqr, 400 $\Omega$/sqr, etc., and it is not limited to the above examples. The square resistance of the doped layer may also be set according to actual requirements. For example, the square resistance of the doped layer may be in a range of 100 $\Omega$/sqr to 300 $\Omega$/sqr.

In the above doped layer diffusion resistance, it is helpful to improve the photoelectric conversion efficiency of the solar cell and thus improve the performance of the solar cell.

Before step S10, a texturing treatment may also be performed on the surface of the semiconductor substrate.

In some embodiments, the texturing treatment is performed to the semiconductor substrate to form a textured surface or a surface texture structure (such as a pyramid structure). Texturing treatment may be selected from chemical etching, laser etching, mechanical method, plasma etching, etc., which is not limited herein.

For example, a wet texturing process may be selected, but not limited thereto, to texture a P-type substrate, and when the P-type substrate is a P-type monocrystalline silicon substrate, an alkaline solution such as a potassium hydroxide solution may be used for texturing; when the P-type substrate is a P-type polycrystalline silicon substrate, an acid solution such as a hydrofluoric acid solution may be used for texturing. In addition, a small amount of texturing additives may be added to the above acidic or alkaline solutions.

In one or more embodiments, texturing is adopted to produce a textural structure for the surface of the silicon substrate, to generate a light trapping effect and increase an amount of light absorbed by the solar cell, thereby improving the conversion efficiency of the solar cell.

Optionally, before the texturing treatment, a step of cleaning the semiconductor substrate may also be included, to remove metal and organic contaminants from the surface.

Step S20, depositing, on the surface of the doped layer, a doped amorphous silicon layer including the doping element.

In one or more embodiments, chemical vapor deposition (CVD), physical vapor deposition (PVD), or atomic layer deposition (ALD) may be adopted for the deposition process to form the doped amorphous silicon layer. Further, plasma enhanced chemical vapor deposition (PECVD) or low-pressure chemical vapor deposition (LPCVD) may be adopted. In addition, the deposition may also adopt other similar deposition methods, which are not limited in the present disclosure. Similarly, equipment used for the deposition can be PVD equipment, ALD equipment, PECVD equipment, LPCVD equipment, and on the like.

Step S20 includes at least the following two implementation modes:

One-step deposition method: forming an amorphous silicon layer on the surface of the doped layer and simultaneously performing an in-situ doping treatment, to form the doped amorphous silicon layer; or, Two-step deposition method: depositing an amorphous silicon layer on the surface of the doped layer, and then doping on the amorphous silicon layer to form the doped amorphous silicon layer.

Figure 2A:
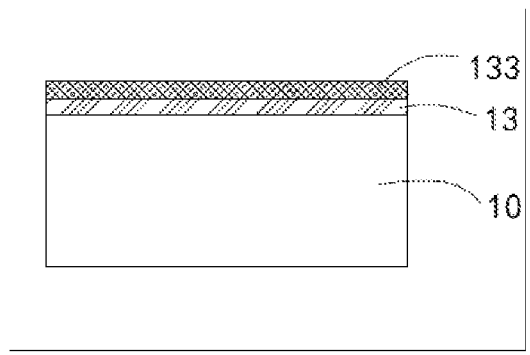
FIG. 2a is a schematic diagram of a partial structure of a solar cell according to one or more embodiments of the present disclosure.
Figure 2B:
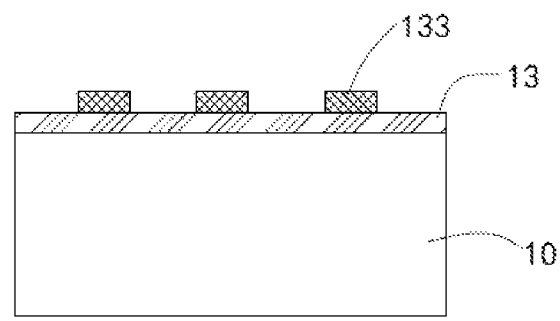
FIG. 2b is a schematic diagram of a partial structure of a solar cell according to another embodiment of the present disclosure.
Figure 2C:
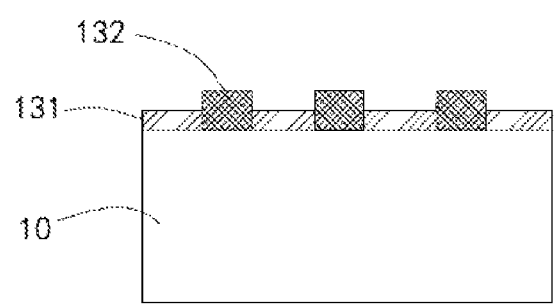
FIG. 2c is a schematic diagram of a partial structure of a solar cell according to another embodiment of the present disclosure.

It should be noted that, as shown in FIGS. 2a-2c, the in-situ doped amorphous silicon is deposited on the surface of the doped layer 13, that is, a method such as PEVCD or PVD is used to form the doped amorphous silicon layer 133, and the amorphous silicon layer is doped while being deposited.

The doping process may also use any one or more methods of high-temperature diffusion, paste doping, or ion implantation. The doped amorphous silicon layer 133 may be a P-type amorphous silicon layer, and its doping element may be selected from the group IIIA, such as boron, gallium or indium. The doped amorphous silicon layer 133 may also be an N-type amorphous silicon layer, and its doping element may be selected from the group VA, such as phosphorus or arsenic.

For example, a thickness of the doped amorphous silicon layer 133 may be in a range from 20 nm to 300 nm, and it may be 20 nm, 50 nm, 80 nm, 100 nm, 150 nm, 180 nm, 200 nm, 250 nm, 300 nm, and it is not limited to the above examples. The thickness of the doped amorphous silicon layer 133 may also be set according to actual requirements. For example, the thickness of the doped amorphous silicon layer 133 is in a range from 50 nm to 150 nm.

In some embodiments, a total thickness of the semiconductor substrate after the first doping treatment (S10) remains unchanged, and a semiconductor locate below the surface by a certain thickness is doped with impurities (boron or phosphorus) to form a P-type or N-type doped layer 13. The doped amorphous silicon layer 133 deposited on the doped layer 13 and the surface of the doped semiconductor substrate 10 form a height difference, such that there is a certain height difference between the heavily doped region 132 and the lightly doped region 131 in the doped layer 13.

Step S30, selectively removing at least one region of the doped amorphous silicon layer 133.

In one or more embodiments, the step of removing at least one region of the doped amorphous silicon layer 133 is performed by, but is not limited to, physical or chemical methods. Exemplarily, the removing process includes:

Providing a protective layer on a predetermined grid line region of the surface of the doped amorphous silicon layer; and Etching a non-predetermined grid line region of the doped amorphous silicon layer through an etching solution and removing the protective layer; or Removing a part of the doped amorphous silicon layer corresponding to the non-predetermined grid line region by a laser removing manner.

It should be noted that the etching solution may be, for example, at least one or more of hydrofluoric acid solution, nitric acid solution, and sulfuric acid solution. As shown in FIG. 2b, after removing the doped amorphous silicon layer in the non-predetermined grid line region, the doping concentration of the doping element in the remaining doped amorphous silicon layer 133 is still greater than the doping concentration of the doping element in the doped layer 13. The predetermined grid line region may refer to a region corresponding to an electrode formed in subsequent steps.

Step S40, performing the annealing treatment, for the semiconductor substrate including the doped layer and the doped amorphous silicon layer so that the doped layer includes a lightly doped region having the first doping concentration and a heavily doped region having a second doping concentration, the second doping concentration being greater than the first doping concentration.

As shown in FIGS. 2b-2c, since the doping concentration of the doping element in the remaining doped amorphous silicon layer 133 is still greater than the doping concentration of the doping element in the doped layer 13, after the annealing treatment, the doped amorphous silicon layer 133 is crystallized to form a doped polycrystalline silicon layer, and at least a part of the doping atoms in the doped amorphous silicon layer 133 are pushed into the doped layer 13, so that the doping concentration of the doping element in the doped layer 13 in the region covering the doped amorphous silicon layer 133 is increased, and the doping concentration of the doping element in the doped layer 13 in the region not covering the doped amorphous silicon layer 133 remains substantially unchanged, so that the doped layer includes a lightly doped region 131 having a first doping concentration and a heavily doped region 132 having a second doping concentration, and the second doping concentration is greater than the first doping concentration. Thus, a selective emitter structure (including a heavily doped region and a lightly doped region) is formed, and the doping atoms in the heavily doped region 132 have a relatively high solid solubility, so that higher activation doping and lower contact resistance can be achieved.

The annealing treatment is performed under protection of an inert atmosphere, and the inert atmosphere includes at least one of nitrogen gas and argon gas, and it may also be a mixed gas of the nitrogen gas and the argon gas.

In some embodiments, a temperature of the annealing treatment is in a range from 700° C. to 950° C., and for example, it may be 700° C., 750° C., 800° C., 840° C., 850° C., 860° C., 880° C., 900° C., 950° C., etc. For example, the temperature of the annealing treatment may be in a range from 800° C. to 900° C.

It is helpful to complete the doping process in a specified region by one-step high temperature annealing treatment within the above temperature of the annealing treatment, and the crystalline silicon structure and electrical properties thereof can be improved, which helps to increase the conversion efficiency of the solar cell.

The square resistance of the doped layer after the doping treatment is in a range from 80 Ω/sqr to 400 Ω/sqr, and for example, it may be 80 Ω/sqr, 100 Ω/sqr, 150 Ω/sqr, 200 Ω/sqr, 250 Ω/sqr, 300 Ω/sqr, 350 Ω/sqr, 400 Ω/sqr, etc., which is not limited to the above examples, and the square resistance of the doped layer may also be set according to actual needs. For example, the square resistance of the doped layer is in a range from 100 Ω/sqr to 300 Ω/sqr.

According to the present disclosure, the doped amorphous silicon layer has a relatively low crystallization temperature, which may avoid defects in the semiconductor substrate due to an excessively high heavily doping temperature; after the doped amorphous silicon layer is crystallized, the doping concentration of the doping atoms in the doped layer is controlled by the deposition process of the amorphous silicon layer, and excessive doping element is not required in heavily doping, which can avoid the adverse effects such as boron-rich layer; in addition, the heavily doped region (including the remaining polycrystalline silicon layer) is higher than the surface of the semiconductor substrate, and there is a certain height difference, so that an impact of a "breakdown effect" in a sintering process of Ag and/or Al paste on the front side of a N-type solar cell can be reduced.

Optionally, after the annealing treatment, a step of cleaning the semiconductor substrate may also be included, and for example, a mixed solution of hydrofluoric acid or hydrochloric acid and hydrogen peroxide may be used for cleaning, to reduce impurities and improve the conversion efficiency. The present disclosure does not limit the specific operation mode or condition of the cleaning, and it may be selected according to actual operations.

Step S50, forming a solar cell by post-processing the annealed semiconductor substrate. The step S50 may include:

Performing a passivation treatment on the surface of the annealed semiconductor substrate to form at least one passivated layer; and Performing a metallization treatment on the surface of the passivated semiconductor substrate to form at least one electrode, the at least one electrode penetrating through the passivated layer and the heavily doped region of the doped layer to form ohmic contact. For example, the electrode is arranged on the polycrystalline silicon layer in the heavily doped region.

For illustration, the passivation treatment is performed on the front side of the semiconductor substrate, to form a front passivated layer on an upper surface of the doped layer. Furthermore, an anti-reflection layer may also be formed on the upper surface of the passivated layer on the front side of the semiconductor substrate.

In some embodiments, the front passivated layer includes any one or a combination of a silicon nitride film (silicon nitride layer), a silicon oxynitride film, and an aluminum oxide/silicon nitride laminated structure. It is appreciated that, the front passivated layer may also adopt other types of passivated layers, and the present disclosure does not limit the specific material of the front passivated layer. The above front passivated layer can produce a good passivation effect on the silicon substrate, which helps to improve the conversion efficiency of the solar cell.

Further, in some embodiments, the passivation treatment may also be performed on a back side of the semiconductor substrate to form a back passivated layer, and the back passivated layer includes any one or a combination of a silicon nitride layer, a silicon oxynitride layer, and an aluminum oxide/silicon nitride laminated structure. It is appreciated that, the back passivated layer may also adopt other types of passivated layers, and the present disclosure does not limit the specific material of the back passivated layer. For example, taking the Topcon cell as an example, an oxidizing treatment may be performed on the back side of the semiconductor substrate after etching, to form a tunnel oxidized layer, then a layer of highly doped polycrystalline silicon layer is formed on a bottom surface of the tunnel oxidized layer, and the two form a passivated contact structure (back passivated layer). The above-mentioned back passivated layer can produce a good passivation effect on the silicon substrate, which helps to improve the conversion efficiency of the solar cell.

Furthermore, a metalizing treatment is performed to the surface of the semiconductor substrate after the passivation treatment to obtain at least one electrode, and the at least one electrode forms ohmic contact with the heavily doped region of the selective emitter through the doped polycrystalline silicon layer. The at least one electrode may be used to collect electrical energy converted by the solar cell.

Optionally, a screen-printing technique is adopted to print conductive paste on the surface of the semiconductor substrate, and then the surface is sintered and dried, to form a grid line electrode. The formed grid line electrode is electrically connected to the semiconductor substrate through the heavily doped region of the doped layer. The conductive paste includes, but is not limited to, silver paste and/or aluminum paste.

In other embodiments, the electrode structure may be formed on the front side and/or the back side of the semiconductor substrate.

It should be noted that, in the present disclosure, unless otherwise specified, respective operation steps may be performed in the above shown sequence or in other sequences. The present disclosure does not limit the sequence of the steps for manufacturing the solar cell, which can be adjusted according to an actual production process.

In the second aspect, one or more embodiments of the present disclosure further provides a solar cell, and the solar cell may be manufactured by any of the above methods.

The solar cell and the method for manufacturing the aforementioned solar cell according to the present disclosure are based on the same inventive concept, so they share all features and advantages described above, which will not be repeated here.

For illustration, the solar cell includes a front electrode, a front anti-reflection layer and/or a front passivated layer, a selective emitter, a semiconductor substrate, a back passivated layer, and a back electrode that are sequentially stacked from top to bottom. The selective emitter includes a lightly doped region having a first doping concentration and a heavily doped region having a second doping concentration.

Figure 3:
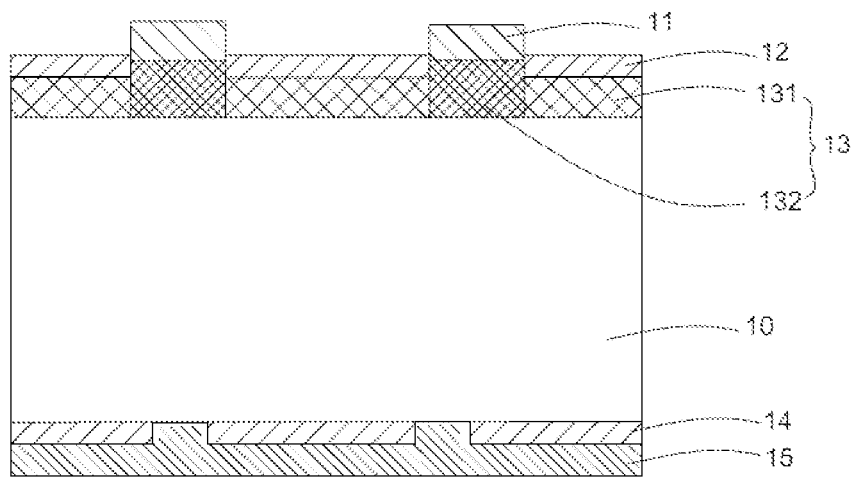
FIG. 3 is a schematic diagram of an overall structure of a PERC solar cell according to one or more embodiments of the present disclosure.

The selective emitter structure is explained in detail below through two exemplary embodiments. As shown in FIG. 3, in one or more embodiments, the solar cell is a solar cell having a PERC structure, and the solar cell includes:

A semiconductor substrate 10, the semiconductor substrate 10 includes a front side and a back side opposed to each other;

A doped layer 13 located on the front side of the semiconductor substrate 10, the doped layer 13 includes a lightly doped region 131 having a first doping concentration and a heavily doped region 132 having a second doping concentration, a selective emitter structure is formed between the heavily doped region 131 and the lightly doped region 132, and the selective emitter structure has a certain height difference;

A front passivated layer and/or anti-reflection layer 12 on an upper surface of the doped layer 13;

A front electrode 11 located on the upper surface of the front passivated layer and/or the anti-reflection layer 12, the front electrode 11 penetrates through the front passivated layer and/or anti-reflection layer 12 and the heavily doped region 131 of the doped layer 13 to form ohmic contact;

A back passivated layer 14 located on the back side of the semiconductor substrate 10; and A back electrode 15 located on a bottom surface of the back passivated layer 8, the back passivated layer 14 is provided with an opening, and at least a part of the back electrode 15 penetrates through the opening to form ohmic contact with the semiconductor substrate 10.

Figure 4:
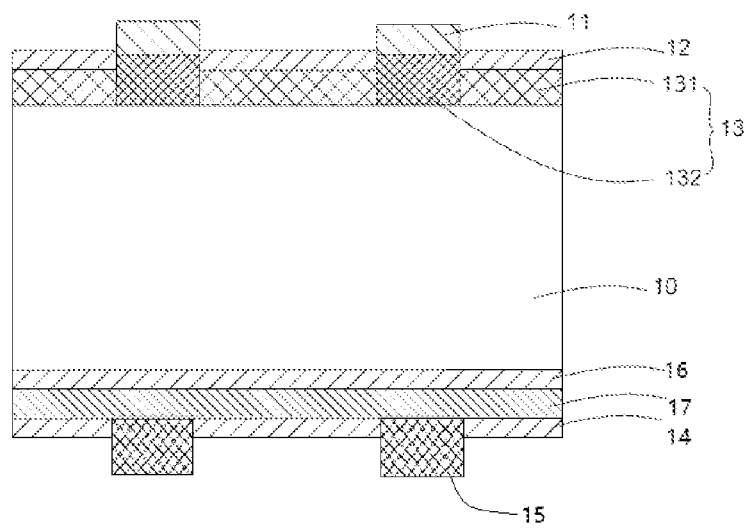
FIG. 4 is a schematic diagram of an overall structure of a Topcon solar cell according to one or more embodiments of the present disclosure.

In another embodiment, the solar cell is a solar cell having a Topcon structure, as shown in FIG. 4, the solar cell includes:

A semiconductor substrate 10, the semiconductor substrate 10 includes a front side and a back side opposite to the front side;

A doped layer 13 on the front side of the semiconductor substrate 10, the doped layer 13 includes a lightly doped region 131 having a first doping concentration and a heavily doped region 132 having a second doping concentration, a selective emitter structure is formed between the heavily doped region 131 and the lightly doped region 132, and the selective emitter structure has a certain height difference.

A front passivated layer and/or anti-reflection layer 12 located on an upper surface of the doped layer 13;

A front electrode 11 located on the upper surface of the front passivated layer and/or anti-reflection layer 12, the front electrode 11 forms ohmic contact with the semiconductor substrate 10 through the heavily doped region 132 of the doped layer 13;

A tunnel oxidized layer 16 located on the back side of the semiconductor substrate 10;

A doped amorphous silicon layer 17 located on a bottom surface of the tunnel oxidized layer 16;

A back passivated layer 14 located on the bottom surface of the doped amorphous silicon layer 17; and A back electrode 15 located on the bottom surface of the back passivated layer 14, the back electrode 15 penetrates through the back passivated layer 14 to form ohmic contact with the doped amorphous silicon layer 17, the doped amorphous silicon layer 17 and the tunnel oxidized layer 16 form a Topcon structure.

For the structure of the solar cell, such as the specific type of each layer, reference can be made to relevant description of the method for manufacturing the solar cell, and it will not be described in detail here.

The materials of the front electrode 11 and the back electrode 15 are not limited in the present disclosure. For example, the front electrode 11 may be a silver electrode or a silver/aluminum electrode, and the back electrode 15 may be a silver electrode.

The specific type of the doped layer 13 is not limited in the present disclosure. For example, the doped layer 13 may be a P-type amorphous silicon layer or an N-type amorphous silicon layer. The specific types of the front passivated layer and/or anti-reflection layer 12 and the back passivated layer 14 are not limited in the present disclosure, and for example, they may be silicon nitride layers, silicon oxynitride layers, aluminum oxide/silicon nitride laminated structures, and the like.

It should also be noted that the present disclosure does not limit the thickness of each layer structure in the foregoing solar cell, and the thickness may be adjusted by those skilled in the art according to actual conditions.

The above descriptions are only exemplary embodiments of the present disclosure and are not intended to limit the present disclosure. For those skilled in the art, the present disclosure may have various modifications and changes. Any modification, equivalent replacement, improvement, etc. made within the spirit and principle of the present disclosure shall be included in the protection scope of the present disclosure.

It should be pointed out that a part of the patent application file of the present disclosure contains content protected by copyright. Except for making copies of the patent documents or the contents of the recorded patent documents of the Patent Office, the copyright owner reserves the copyright.

What is claimed is:

1. A solar cell, comprising:
    a semiconductor substrate having a front side and a back side opposite to each other;
    a doped layer located on the front side of the semiconductor substrate, wherein the doped layer has a lightly doped region having a first doping concentration and a heavily doped region having a second doping concentration greater than the first doping concentration, and the heavily doped region protrudes from a surface of the semiconductor substrate and includes doped polycrystalline silicon;
    a front passivated layer and/or a anti-reflection layer located on a surface of the doped layer facing away from the semiconductor substrate; and
    a front electrode located on a surface of the front passivated layer and/or the anti-reflection layer facing away from the doped layer, wherein the front electrode penetrates through the front passivated layer and/or the anti-reflection layer to form an ohmic contact with the heavily doped region of the doped layer,
    wherein the solar cell further comprises:
    a tunnel oxidized layer located on the back side of the semiconductor substrate;
    a doped amorphous silicon layer located on a surface of the tunnel oxidized layer facing away from the semiconductor substrate;
    a back passivated layer located on a surface of the doped amorphous silicon layer facing away from the tunnel oxidized layer; and
    a back electrode located on a surface of the back passivated layer facing away from the doped amorphous silicon layer, wherein the back electrode penetrates through the back passivated layer to form an ohmic contact with the doped amorphous silicon layer.

2. The solar cell according to claim 1, wherein the doped layer having a polarity opposite to the semiconductor substrate.

3. The solar cell according to claim 1, wherein a square resistance of the doped layer is in a range from 80 Ω/sqr to 400 Ω/sqr.

4. The solar cell according to claim 1, wherein the semiconductor substrate has a textured surface.

5. The solar cell according to claim 1, further comprising:
    a back passivated layer located on the back side of the semiconductor substrate; and
    a back electrode located on a surface of the back passivated layer facing away from the semiconductor substrate, wherein an opening is provided on the back passivated layer, and at least a part of the back electrode penetrates through the opening to form an ohmic contact with the semiconductor substrate.

6. The solar cell according to claim 1, wherein the front passivated layer comprises at least one of a silicon nitride layer, a silicon oxynitride layer, or an aluminum oxide/silicon nitride laminated structure.

7. The solar cell according to claim 5, wherein the front passivated layer comprises at least one of a silicon nitride layer, a silicon oxynitride layer, or an aluminum oxide/silicon nitride laminated structure, and
    the back passivated layer comprises at least one of a silicon nitride layer, a silicon oxynitride layer, or an aluminum oxide/silicon nitride laminated structure.

8. The solar cell according to claim 1, wherein the front passivated layer comprises at least one of a silicon nitride layer, a silicon oxynitride layer, or an aluminum oxide/silicon nitride laminated structure, and
    the back passivated layer comprises at least one of a silicon nitride layer, a silicon oxynitride layer, or an aluminum oxide/silicon nitride laminated structure.

9. The solar cell according to claim 1, wherein the doped polycrystalline silicon is formed by crystallizing a doped amorphous silicon.

10. A method for manufacturing a solar cell, comprising:
    forming a doped layer on a front surface of a semiconductor substrate, the doped layer having a first doping concentration of a doping element in the doped layer;
    depositing, on a surface of the doped layer, a doped amorphous silicon layer including the doping element;

selectively removing at least one region of the doped amorphous silicon layer;

performing an annealing treatment, for the semiconductor substrate including the doped layer and the doped amorphous silicon layer, to form a lightly doped region having the first doping concentration and a heavily doped region having a second doping concentration in the doped layer, wherein the second doping concentration is greater than the first doping concentration, and the heavily doped region protrudes from the front surface of the semiconductor substrate and includes doped polycrystalline silicon;

performing a passivation treatment on the surface of the annealed semiconductor substrate to form at least one passivated layer; and performing a metallization treatment on the surface of the passivated semiconductor substrate to form at least one electrode, the at least one electrode penetrating through the at least one passivated layer to form ohmic contact with the heavily doped region of the doped layer, wherein the method further comprises:

performing oxidizing treatment on a back surface of the semiconductor substrate to form a tunnel oxidized layer;

forming a doped amorphous silicon layer on a surface of the tunnel oxidized layer facing away from the semiconductor substrate;

forming a back passivated layer on a surface of the doped amorphous silicon layer facing away from the tunnel oxidized layer; and forming a back electrode on a surface of the back passivated layer facing away from the doped amorphous silicon layer, so that the back electrode penetrates through the back passivated layer to form an ohmic contact with the doped amorphous silicon layer.

11. The method for manufacturing a solar cell according to claim 10, wherein a thickness of the doped amorphous silicon layer is in a range from 20 nm to 300 nm.

12. The method for manufacturing a solar cell according to claim 10, wherein the depositing, on the surface of the doped layer, the doped amorphous silicon layer including the doping element comprises:

forming an amorphous silicon layer on the surface of the doped layer and simultaneously performing in-situ doping to form the doped amorphous silicon layer.

13. The method for manufacturing a solar cell according to claim 10, wherein the depositing, on the surface of the doped layer, the doped amorphous silicon layer including the doping element comprises:

depositing an amorphous silicon layer on the surface of the doped layer, and then doping on the amorphous silicon layer to form the doped amorphous silicon layer.

14. The method for manufacturing a solar cell according to claim 10, wherein the selectively removing the at least one region of the doped amorphous silicon layer comprises:

providing a protective layer on a predetermined grid line region of a surface of the doped amorphous silicon layer; and etching a non-predetermined grid line region of the doped amorphous silicon layer with an etching solution and removing the protective layer.

15. The method for manufacturing a solar cell according to claim 10, wherein the selectively removing the at least one region of the doped amorphous silicon layer comprises:

providing a protective layer on a predetermined grid line region of a surface of the doped amorphous silicon layer; and removing a part of the doped amorphous silicon layer corresponding to a non-predetermined grid line region of a surface of the doped amorphous silicon layer by a laser removing manner.

16. The method for manufacturing a solar cell according to claim 10, wherein the depositing, on the surface of the doped layer, the doped amorphous silicon layer including the doping element is performed by any one of a chemical vapor deposition, a physical vapor deposition and an atomic layer deposition.

17. The method for manufacturing a solar cell according to claim 10, wherein said doping on the surface of the semiconductor substrate to form the doped layer comprises:

forming the doped layer having a polarity opposite to the semiconductor substrate by adopting any one of a high temperature diffusion process, a paste doping process, or an ion implantation process.

18. The method for manufacturing a solar cell according to claim 10, wherein the annealing treatment is performed under protection of an inert atmosphere, and the inert atmosphere comprises at least one of nitrogen gas and argon gas, and a temperature of the annealing treatment is in a range from 700° C. to 950° C.

19. The method for manufacturing a solar cell according to claim 10, wherein a square resistance of the doped layer is in a range from 80 Ω/sqr to 400 Ω/sqr.

* * * * *

UNITED STATES PATENT AND TRADEMARK OFFICE
CERTIFICATE OF CORRECTION

PATENT NO. : 11,721,783 B2  
APPLICATION NO. : 17/578868  
DATED : August 8, 2023  
INVENTOR(S) : Jie Yang et al.

Page 1 of 1

It is certified that error appears in the above-identified patent and that said Letters Patent is hereby corrected as shown below:

On the Title Page

Item (73) Assignee replace:
"Shangrao Jinko solarTechnology Development Co.,LTD, Jiangxi Province (CN)"
With:
-- JINKO GREEN ENERGY (SHANGHAI) MANAGEMENT CO., LTD, Shanghai (CN);
ZHEJIANG JINKO SOLAR CO., LTD, Zhejiang (CN) --

Signed and Sealed this
Twenty-fourth Day of September, 2024

Katherine Kelly Vidal
*Director of the United States Patent and Trademark Office*